(12) United States Patent
Dawson et al.

(10) Patent No.: US 7,299,374 B2
(45) Date of Patent: Nov. 20, 2007

(54) CLOCK CONTROL METHOD AND APPARATUS FOR A MEMORY ARRAY

(75) Inventors: James W. Dawson, Poughkeepsie, NY (US); Paul A. Bunce, Poughkeepsie, NY (US); Donald W. Plass, Poughkeepsie, NY (US); Kenneth J. Reyer, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 11/050,580

(22) Filed: Feb. 3, 2005

(65) Prior Publication Data

US 2006/0174153 A1    Aug. 3, 2006

(51) Int. Cl.
*G06F 1/08*    (2006.01)
*G06F 1/04*    (2006.01)

(52) U.S. Cl. .................. 713/501; 713/500; 713/600
(58) Field of Classification Search ............ 713/6, 713/600, 501, 500
See application file for complete search history.

(56) References Cited

U.S. PATENT DOCUMENTS 4,851,711 A * 7/1989 Chan et al. ................. 327/285
5,172,010 A * 12/1992 Montegari ................... 327/172
5,336,939 A * 8/1994 Eitrheim et al. ............ 327/291
5,420,467 A * 5/1995 Huott et al. ................ 327/174
5,615,169 A * 3/1997 Leung ...................... 365/223.5
5,708,624 A * 1/1998 Leung ........................ 365/233

\* cited by examiner

*Primary Examiner*—Thomas Lee
*Assistant Examiner*—Michael Wang
(74) *Attorney, Agent, or Firm*—Lynn L. Augspurger, Esq.; Kevin P. Radigan, Esq.; Heslin Rothenber Farley & Mesiti, P.C.

(57) ABSTRACT

A clock control method and apparatus are provided employing a clock control circuit which generates an array clock for a memory array from a system clock and a reset control signal. The reset control signal is one of a plurality of input control signals to the clock control circuit. When the system clock is below a predefined frequency threshold, the reset control signal is an array tracking reset signal, wherein the active pulse width of the array clock is system clock frequency independent, and when the system clock is above the predefined frequency threshold, the reset control signal is a mid-cycle reset signal, meaning that the active pulse width of the array clock is system clock frequency dependent. A bypass signal is provided as a third input control signal, which when active causes the clock control circuit to output an array clock which mirrors the system clock.

20 Claims, 5 Drawing Sheets

CLOCK CONTROL METHOD AND APPARATUS FOR A MEMORY ARRAY

TECHNICAL FIELD OF THE INVENTION

This invention relates in general to the operation of memory arrays, and more particularly, to a method and apparatus for controlling generation of an array clock for use in clocking internal operations of a memory array.

BACKGROUND OF THE INVENTION

Typical clock distribution schemes include a clock generation circuit integrated with a memory array to provide a clock signal which controls the internal operations of the memory array. This array clock is conventionally generated from a system clock, and typically has a pulse width which is dependent upon the frequency of the system clock.

There are two portions to an array clock, i.e., an active portion and an inactive (or reset) portion. During the active portion of the array clock cycle, the memory array is accessed and read or write operations are performed. During the inactive portion of the array clock cycle, the internal timings of the memory array are reset to a predetermined state. For the array to function properly, there should be an adequate amount of active clock time and an adequate amount of inactive clock time. An excess amount of either will result in wasted cycle time, or frequency, while an insufficient amount of either will result in failure of the circuit.

Ideally, there is a small amount of margin in both the active and inactive portions of the clock cycle to balance a maximum operational frequency with a robust design point. The robust design point is required to account for process and environmental variations and tolerances across circuits within the given memory array to allow for a reasonable yield. Thus, provided herein is a novel clock control method and apparatus for a memory array which addresses these concerns.

SUMMARY OF THE INVENTION

The shortcomings of the prior art are overcome and additional advantages are provided through the provision of a clock control method which includes: generating an array clock for an array from a system clock and a reset control signal, the reset control signal comprising an array tracking reset signal; and switching the reset control signal to a mid-cycle reset signal whenever the system clock exceeds a predefined frequency threshold, wherein when the array tracking reset signal is employed, an active pulse width of the array clock is system clock frequency independent, and when the mid-cycle reset signal is employed, the active pulse width of the array clock is system clock frequency dependent.

In another aspect, a clock control apparatus is provided which includes a clock control circuit. The clock control circuit generates an array clock for an array from a system clock and a reset control signal. The reset control signal is one of a plurality of input control signals. The clock control circuit automatically employs a first input control signal as the reset control signal when the system clock is below a predefined frequency threshold, and a second input control signal when the system clock exceeds the predefined frequency threshold. When the reset control signal comprises the first input control signal, a pulse width of the generated array clock is system clock frequency independent, and when the reset control signal comprises the second input control signal, the pulse width of the generated array clock is system clock frequency dependent.

In a further aspect, a clock control circuit is provided. This clock control circuit includes means for generating an array clock for an array from a system clock and a reset control signal. The reset control signal comprises an array tracking reset signal. The circuit further includes means for switching the reset control signal to a mid-cycle reset signal when the system clock exceeds a predefined frequency threshold. When the reset control signal comprises the array tracking reset signal, a pulse width of the array clock is system clock frequency independent, and when the reset control signal comprises the mid-cycle reset signal, the pulse width of the array clock is system clock frequency dependent.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

An noted above, internal clocks for memory arrays, such as static random access memories (SRAMs) require minimum active pulse widths. The active pulse width should be wide enough to allow sufficient time to perform the addressing, decoding, reading, writing, etc., functions of the memory array, while the inactive portion of the array clock should be sufficient to allow resetting of the array for today's high frequency operation. The array clock pulse width (i.e., the active portion of the array clock cycle) should also track the performance of the remainder of the memory array for robust operation. In accordance with the present invention, during normal operation the active portion of the array clock cycle is controlled to a greater extent than the inactive portion of the cycle. This is because an inadequate active pulse width will result in array failure more quickly than an inadequate inactive cycle time.

In accordance with one aspect of the present invention, multiple array clocking options are employed. These different clocking options derive from multiple reset control signals provided as inputs to a clock control circuit. When the reset control signal comprises an array tracking reset signal, the pulse width of the array clock is system clock frequency independent, and when the reset control signal comprises a mid-cycle reset signal, the pulse width of the array clock is system clock frequency dependent. Further, there is an automatic switching of the reset control signal from the array tracking reset signal (normal operation) to the mid-cycle reset signal when the system clock exceeds a predefined upper frequency threshold. This predefined frequency threshold is such that the inactive portion of the array cycle time is insufficient for proper operation of the memory array to continue with the active pulse width of the array clock being defined using the array tracking reset signal. Additionally, a bypass signal is provided as one of the reset control signals. When the bypass signal is active a "DC mode" is entered by the clock control circuit where the array clock tracks the system clock. This particular option would be desirable in, for example, a test situation. Each of the reset control signals, and the clock control technique outlined above, are described in greater detail below with reference to FIGS. 1-7.

Figure 1:
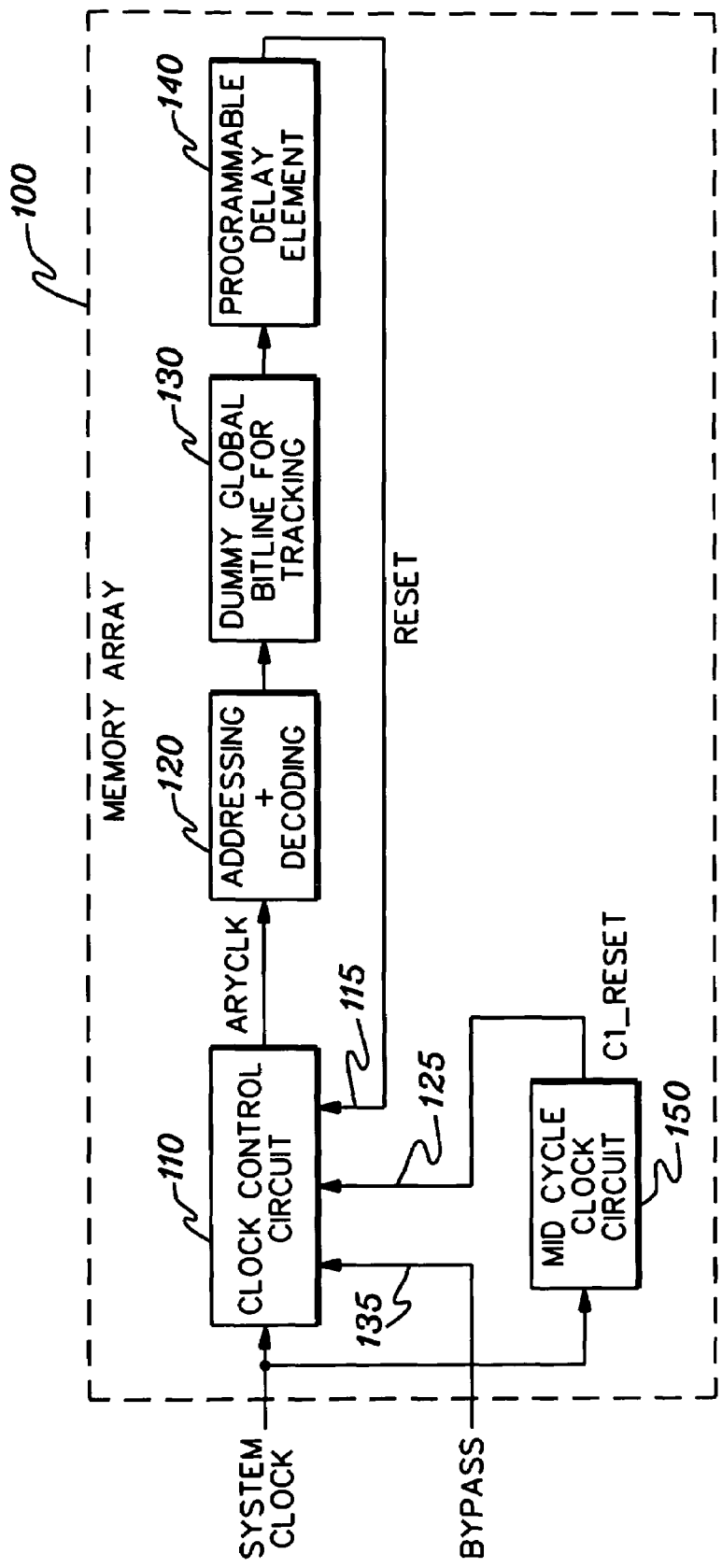
FIG. 1 is a block diagram of one embodiment of a memory array with a clock control apparatus and circuit, in accordance with an aspect of the present invention.

FIG. 1 is simplified block diagram of one embodiment of a memory array 100, such as an SRAM, for which an array clock (ARYCLK) is to be generated in accordance with aspects of the present invention. A system clock is input to a clock control circuit 110 of memory array 100 from which the array clock is generated employing one of the multiple reset control signals, labeled reset 115, C1_reset 125, and bypass 135. Reset signal 115 is an array tracking reset signal which is generated by propagating the array clock through, for example, a portion of the memory array (such as addressing and decoding circuitry 120), as well as a dummy global bitline 130 for further tracking of memory array operations, and a programmable delay element 140. Output from the addressing and decoding circuitry can be obtained by tapping off an appropriate address and decoding bitline. Preferably, the tap is made as far down the array circuitry as possible. By way of example, a local column decode line of addressing and decoding circuitry 120 may be tapped, meaning that the array clock has already propagated through at least some of the global and local row and column decode circuitry, as well as subarray addressing. The dummy global bitline 130 facilitates further mimicking of the actual memory array's performance. This dummy bitline may comprise similar circuits and topologies employed by actual bitlines of the memory array. The programmable delay element 140 provides programmability of the resulting pulse width. The intent of this technique is to mimic as much of the delay path through the memory array as possible so that as the memory array speeds up and slows down, reset signal 115 will automatically adjust accordingly. In this way, the reset signal can be characterized as being self-timed by the memory array. Thus, different manufacturing process variations and environmental variations between memory arrays will results in slight adjustments to the reset signal 115.

As explained further below, when the reset signal 115 goes high, the pulse width of the array clock signal is defined under normal operations. Thus, the pulse width of the array clock is system clock frequency independent using the array tracking reset signal.

The C1_reset signal 125 is provided as a high frequency reset signal which is automatically employed when the system clock exceeds a frequency threshold. Where the switching threshold occurs will vary with size and architecture of the memory array. For example, certain memory arrays may be small, and can run at 8 GHz under normal operation, while very large memory arrays may only run at 1 GHz normally, but still be on the same chip with the same processor. The C1_reset signal 125 is generated by a mid-cycle clock circuit 150 from the system clock. By way of example, clock circuit 150 could comprise an inverter and delay logic such that the C1_reset signal is principally a delayed inversion of the system clock. Thus, when the array clock is generated from the C1_reset signal 125, the pulse width of the array clock is system clock frequency dependent.

The third reset control signal depicted in FIG. 1 is bypass signal 135. When this signal is active, the array clock mirrors the system clock, with some slight delay. This signal allows the memory array to operate in a "DC mode", where the internal array clock is the system clock, and the system clock could be slowed down to, for example, the megahertz range for testing purposes. This bypass signal is an external control signal from, for example, the system controller (not shown).

Figure 2:
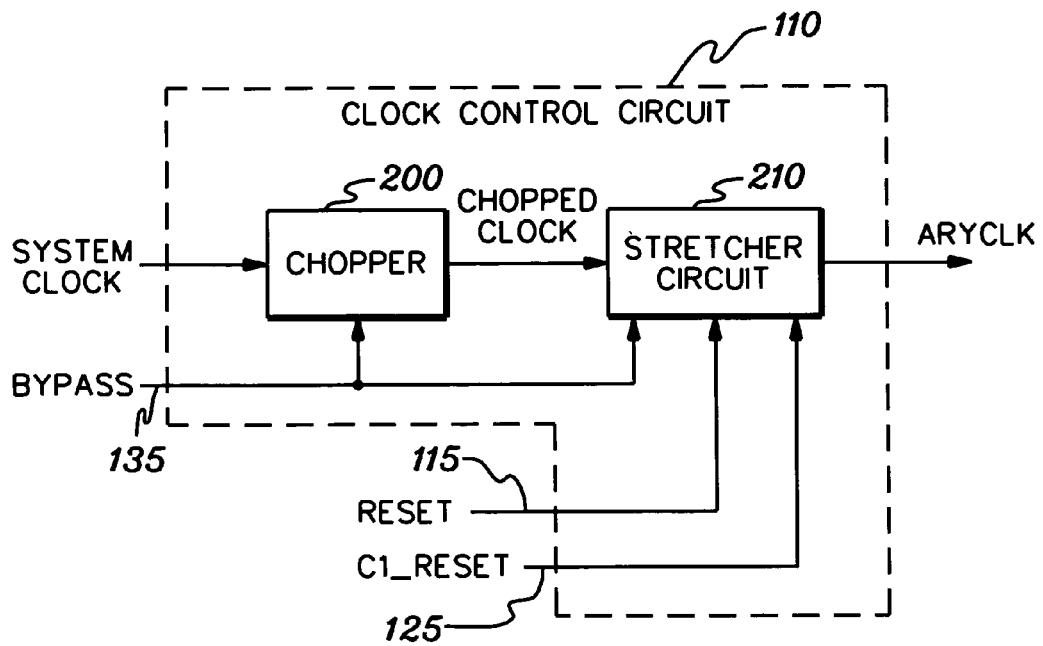
FIG. 2 is a block diagram of one embodiment of the clock control circuit of FIG. 1, in accordance with an aspect of the present invention.

FIG. 2 depicts one embodiment of clock control circuit 110. As shown, the system clock is input to a chopper 200 which outputs a chopped clock signal. One skilled in the art will recognize that chopper 200 could comprise any available circuit to truncate a wide pulse width signal to a narrow pulse width signal. An appropriate delay is provided within the chopper circuit to define the pulse width of the narrower chopped clock signal. The chopped clock signal is then input to a stretcher circuit 210 which outputs the array clock (ARYCLK). Reset control signals reset 115, C1_reset 125, and bypass 135 are input to stretcher circuit 210 to facilitate stretching of the narrow chopped clock pulse signal to the array clock signal having the desired active pulse width.

Figure 3:
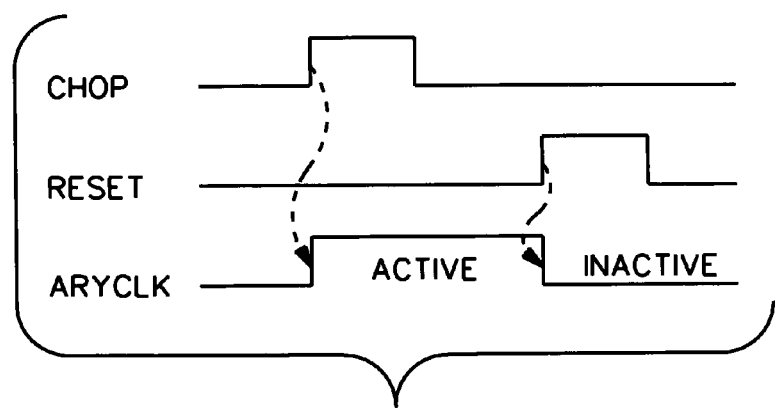
FIG. 3 is a basic timing diagram showing generation of an array clock (ARYCLK) employing the chopped clock produced by the clock control circuit of FIG. 2, and the reset control signal input to the clock control circuit, in accordance with an aspect of the present invention.

As shown in FIG. 3, during normal operation, when the chopped clock signal goes high, the active pulse width for the array clock is initiated and when the reset signal 115 goes high, the active pulse width is terminated, thereby initiating the inactive portion of the array clock cycle. Thus, the width of the array clock is determined by the leading edge of the chopped clock pulse and the leading edge of one of the reset control signals.

Figure 4:
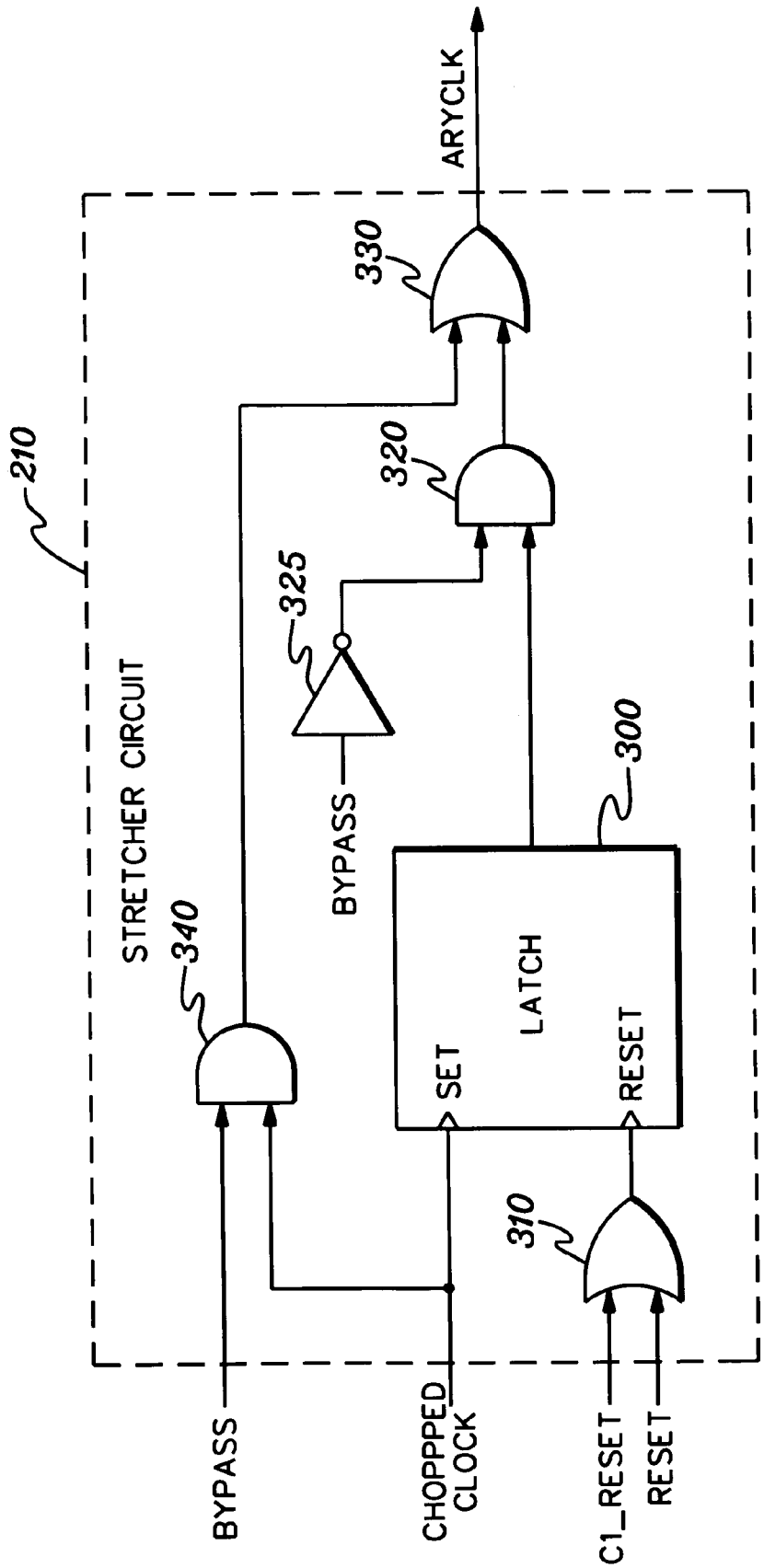
FIG. 4 is a block diagram of one embodiment of a stretcher circuit for the clock control circuit of FIG. 2, in accordance with an aspect of the present invention.

FIG. 4 depicts one embodiment of a stretcher circuit 210, in accordance with an aspect of the present invention. During normal operation, the chopped clock signal sets a latch 300, meaning that the output of latch 300 goes high. Since in normal operation, the bypass signal is assumed inactive, the inversion 325 of this signal is high which results in a high output from AND gate 320. Since AND gate output 320 is high, the output of OR gate 330 is also high, i.e., the array clock signal is high. Latch 300 remains set until one of the reset control signals (i.e., reset or C1_reset) goes high. These reset control signals are passed through an OR gate 310, the output of which is provided to the reset input of latch 300. Thus, when the earliest of reset 115 or C1_reset 125 goes high, the output of latch 300 goes low, meaning that the array clock cycles to the inactive portion.

As noted above, when the bypass signal is high, (for example, representative of a system test mode) the system clock is passed through chopper 200 (FIG. 2) as the chopped clock. This signal is combined with the high bypass signal in AND gate 340 before being passed to OR gate 330 and output as the array clock. Note that when the bypass signal is high, the inversion of the signal by inverter 325 results in a low input to AND gate 320, and thus a low output from the AND gate, thereby bypassing operation of latch 300.

Figure 5:
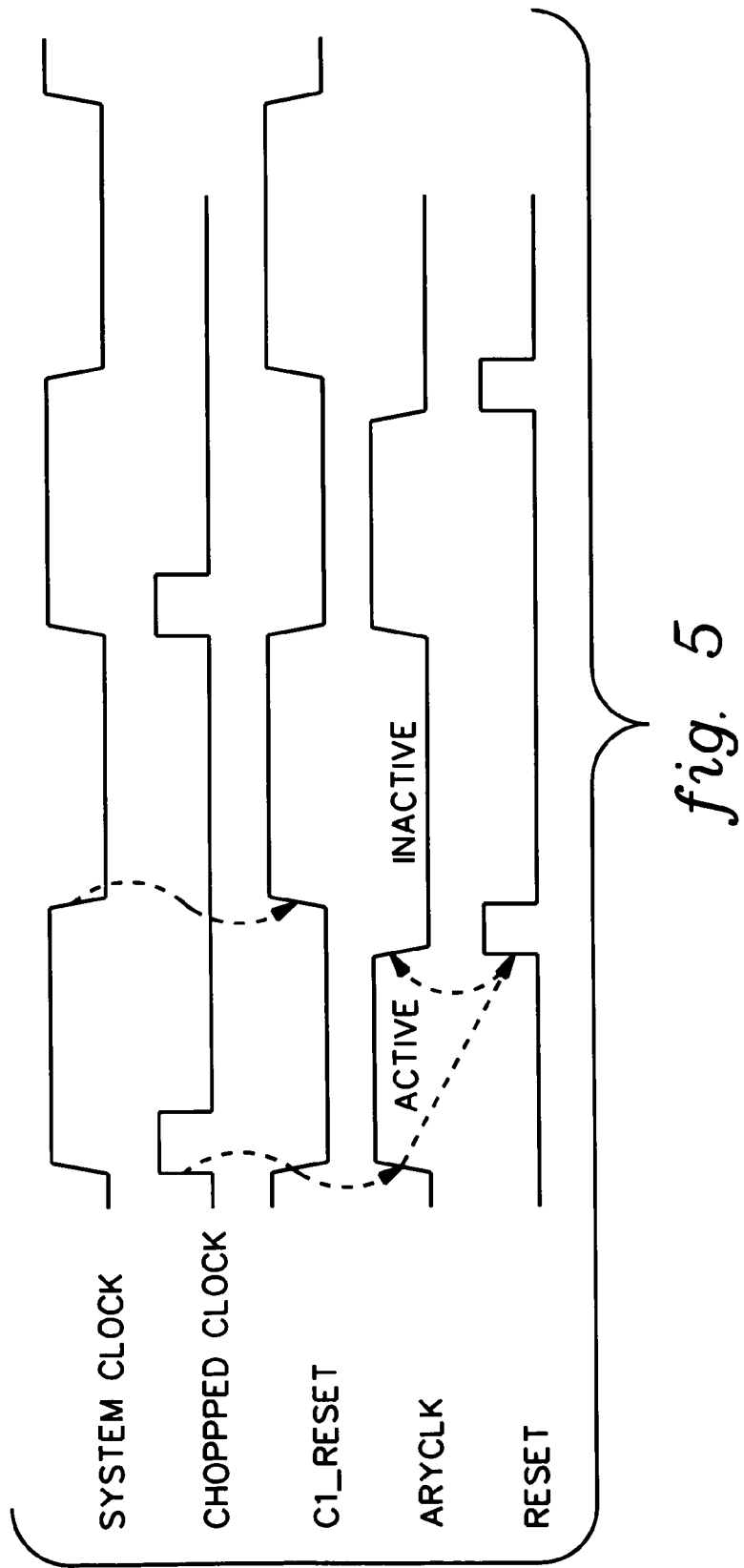
FIG. 5 is a timing diagram showing normal operation of the clock control circuit, wherein the array clock signal is generated from the chopped clock and the array tracking reset signal, in accordance with an aspect of the present invention.
Figure 6:
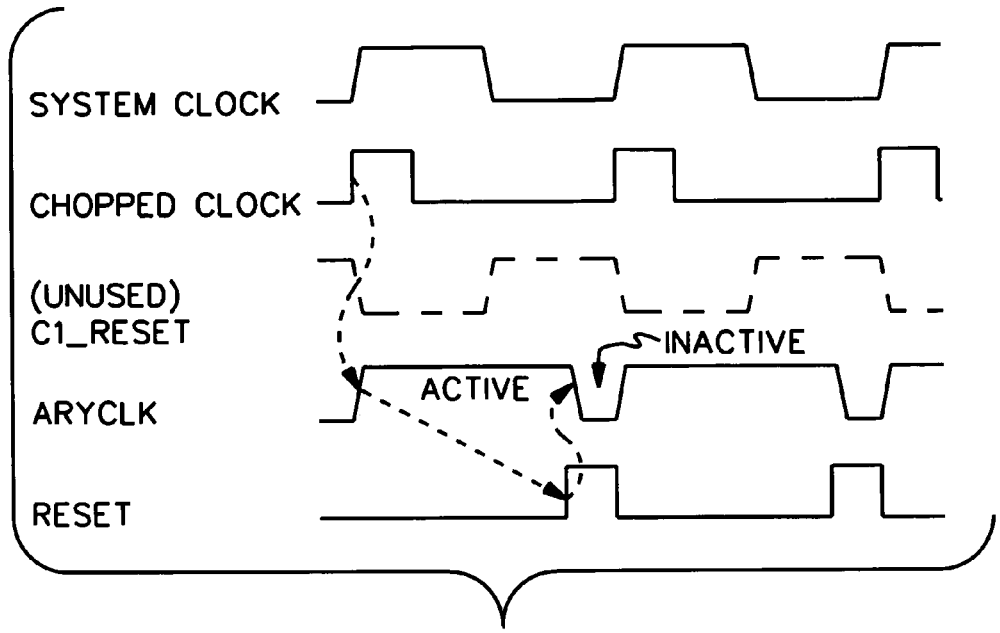
FIG. 6 is a timing diagram showing a potential timing problem arising with the array clock if only the chopped clock and array tracking reset signal are employed, in accordance with an aspect of the present invention.
Figure 7:
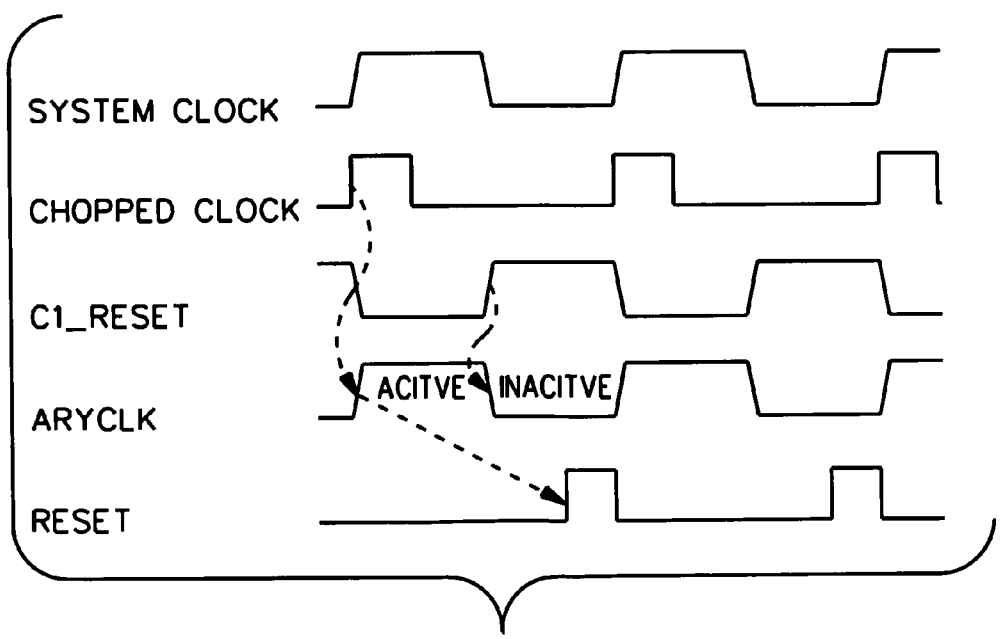
FIG. 7 is a timing diagram showing the array clock after switching of the reset control signal from the system clock frequency independent reset (i.e., the array tracking reset signal) to the frequency dependent C1_reset signal to balance the active and inactive portions of the array clock, in accordance with an aspect of the present invention.

FIGS. 5-7 depict timing diagrams showing generation of the array clock signal (ARYCLK) for different system clock frequencies. In FIG. 5, normal operation is assumed wherein the pulse width of the array clock is determined by the array tracking reset signal (reset signal 115 of FIG. 1). As shown, the system clock going active intitates the chopped clock pulse, which in turn initiates the active portion of the array clock cycle. This array clock signal, after propagating through the addressing and decoding circuitry, the dummy global bitline and the programmable delay element of FIG. 1, results in a reset pulse going active. This reset pulse going active in turn drives the array clock inactive as explained above in connection with the stretcher circuit of FIG. 4. Thus, during normal operation, the C1_reset signal does not control the pulse width of the array clock, meaning that the array clock pulse width is system clock frequency independent. As also shown in FIG. 5, the C1_reset signal goes active when the system clock goes inactive. This is because, as explained above, the C1_reset signal is principally an inversion of the system clock signal. The timing diagram of FIG. 5 holds for the designed normal operation of the memory array, as well as for lower frequency system clock operation. At lower frequency operation than designed, the inactive portion of the array clock cycle is simply extended.

In FIG. 6, the system clock frequency is assumed to increase over that of FIG. 5 and be above an intended operational range for the memory array. In this case, the chopped clock signal is again initiated from the system clock going high, which results in initiation of the active cycle of the array clock. Assuming in FIG. 6 that the C1_reset signal is unused or unavailable, then the active cycle portion of the array clock is terminated with the array tracking reset signal going high as explained above in connection with FIG. 5. However, in this case, since the system clock frequency is higher than the intended normal operation for the memory array, the inactive portion of the clock cycle is small, and assumed to be insufficient for resetting of the memory array in preparation for the next cycle. The result is a failure of the memory array operation.

Thus, in accordance with an aspect of the present invention, normal operation of the memory array can be extended to a higher system clock frequency by automatically switching the reset control signal from the array tracking reset signal to the mid-cycle reset signal (C1_reset). This is depicted in FIG. 7.

As shown in FIG. 7, the chopped clock signal is again initiated by the system clock going high, which in turn initiates the array clock signal (ARYCLK). Due to the higher frequency system clock, the C1_reset signal, which is principally an inversion of the system clock signal, will go high sooner than the array tracking reset signal. As explained above in connection with FIG. 4, this results in earlier termination of the active portion of the array clock cycle, i.e., before the array tracking reset signal goes high. The result in an increase in the inactive portion of the array clock cycle and a decrease in the active portion. The goal is to extend the operational frequency of the memory array clock when the system clock slightly exceeds its normal operating range. Should the system clock frequency go too high, then the array clock signal will break down due to insufficient active cycle time. However, at such a high frequency, other components of the system would also be breaking down due to the system clock frequency being too far above the designed operational range.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A clock control method comprising:
   generating an array clock for an array from a system clock and a reset control signal, the reset control signal comprising an array tracking reset signal;
   switching the reset control signal to a mid-cycle reset signal when the system clock exceeds a predefined frequency threshold; and
   wherein when the reset control signal comprises the array tracking reset signal, a pulse width of the array clock is system clock frequency independent, and when the reset control signal comprises the mid-cycle reset signal, the pulse width of the array clock is system clock frequency dependent.

2. The method of claim 1, wherein the generating of the array clock further comprises chopping the system clock to produce a chopped clock and stretching the chopped clock using the reset control signal, wherein the array clock goes active with a rising edge of the chopped clock and goes inactive with a rising edge of the reset control signal.

3. The method of claim 1, wherein the array tracking reset signal comprises a reset signal triggered active by the array clock after propagating through at least a portion of the array, and wherein the array tracking reset signal defines a sufficient active pulse width for the array clock to ensure completion of operations within the array.

4. The method of claim 3, further comprising providing the array tracking reset signal, the providing comprising passing the array clock through the portion of the array, and through a dummy global bitline and a programmable delay element, wherein clock delay through the portion of the array, the dummy global bitline and the programmable delay element defines the active pulse width of the array clock.

5. The method of claim 1, wherein the generating is performed by a clock control circuit, and wherein the array tracking reset signal and the mid-cycle reset signal comprise inputs to the clock control circuit, and the method further comprises providing a bypass input to the clock control circuit, wherein when the bypass input is active, the array clock mirrors the system clock.

6. The method of claim 1, wherein the switching occurs automatically when the system clock exceeds the predefined frequency threshold, and wherein the switching further comprises switching the reset control signal to the array tracking reset signal when the system clock falls below the predefined frequency threshold.

7. The method of claim 1, wherein the array comprises a memory array, and wherein the array tracking reset signal is a feedback signal driven by the array clock after propagating through at least a portion of the memory array, and the mid-cycle reset signal is derived directly from the system clock, independent of the array clock, and wherein the mid-cycle reset signal balances the active and inactive portions of the array clock.

8. A clock control apparatus comprising:
a clock control circuit, the clock control circuit generating an array clock for an array from a system clock and a reset control signal, the reset control signal being one of a plurality of input control signals; and
wherein the clock control circuit automatically employs a first input control signal as the reset control signal when the system clock is below a predefined frequency threshold and a second input control signal when the system clock exceeds the predefined frequency threshold, and wherein when the reset control signal comprises the first input control signal, a pulse width of the array clock is system clock frequency independent, and when the reset control signal comprises the second input control signal, the pulse width of the array clock is system clock frequency dependent.

9. The clock control apparatus of claim 8, wherein the plurality of the input control signals further comprises a bypass signal which when active causes the clock control circuit to output an array clock which mirrors the system clock.

10. The clock control apparatus of claim 8, wherein the array comprises a memory array, the first input control signal comprises an array tracking reset signal, and the second input control signal comprises a mid-cycle reset signal, wherein the array tracking reset signal comprises a feedback signal driven by the array clock after propagating through at least a portion of the memory array, and the mid-cycle reset signal is derived directly from the system clock, independent of the array clock, and wherein the mid-cycle reset signal balances active and inactive portions of the array clock cycle.

11. The clock control apparatus of claim 10, wherein the array tracking reset signal is a feedback signal driven by the array clock propagating through the portion of the memory array, and through a dummy global bitline and a programmable delay element, and wherein clock delay through the portion of the array, the dummy global bitline and the programmable delay element defines an active pulse width of the array clock.

12. The clock control apparatus of claim 8, wherein the clock control circuit comprises a chopping circuit and a stretching circuit, the chopping circuit chopping the system clock to produce a chopped clock, and the stretching circuit stretching the chopped clock using the reset control signal, wherein the array clock goes active with a rising edge of the chopped clock and goes inactive with a rising edge of the reset control signal.

13. The clock control apparatus of claim 12, wherein the first input control signal is a feedback signal driven by the array clock after propagating through at least a portion of the memory array, and the second input control signal is derived directly from the system clock, independent of the array clock, and wherein the second input control signal balances the active and inactive portions of the array clock.

14. A clock control circuit comprising:
means for generating an array clock for an array from a system clock and a reset control signal, the reset control signal comprising an array tracking reset signal;
means for switching the reset control signal to a mid-cycle reset signal when the system clock exceeds a predefined frequency threshold; and
wherein when the reset control signal comprises the array tracking reset signal, a pulse width of the array clock is system clock frequency independent, and when the reset control signal comprises the mid-cycle reset signal, the pulse width of the array clock is system clock frequency dependent.

15. The clock control circuit of claim 14, wherein the means for generating the array clock further comprises means for chopping the system clock to produce a chopped clock and means for stretching the chopped clock using the reset control signal, wherein the array clock goes active with a rising edge of the chopped clock and goes inactive with a rising edge of the reset control signal.

16. The clock control circuit of claim 14, wherein the array tracking reset signal comprises a reset signal triggered active by the array clock after propagating through at least a portion of the array, and wherein the array tracking reset signal defines a sufficient active pulse width for the array clock to ensure completion of operations within the array.

17. The clock control circuit of claim 16, further comprising means for providing the array tracking reset signal, the means for providing comprising the portion of the array, and through a dummy global bitline and a programmable delay element, wherein clock delay through the portion of the array, the dummy global bitline and the programmable delay element defines the active pulse width of the array clock.

18. The clock control circuit of claim 14, wherein the means for generating comprises a clock control circuit, and wherein the array tracking reset signal and the mid-cycle reset signal comprise inputs to the clock control circuit, and the clock control circuit further comprises a bypass input to the clock control circuit, wherein when the bypass input is active, the array clock mirrors the system clock.

19. The clock control circuit of claim 14, wherein the means for switching is automatic when the system clock exceeds the predefined frequency threshold, and wherein the means for switching further comprises means for switching the reset control signal to the array tracking reset signal when the system clock falls below the predefined frequency threshold.

20. The clock control circuit of claim 14, wherein the array comprises a memory array, and wherein the array tracking reset signal is a feedback signal driven by the array clock after propagating through at least a portion of the memory array, and the mid-cycle reset signal is derived directly from the system clock, independent of the array clock, and wherein the mid-cycle reset signal balances the active and inactive portions of the array clock.

\* \* \* \* \*